USOO5742004A

United States Patent [19]
Greco et al.

[11] Patent Number: 5,742,004
[45] Date of Patent: Apr. 21, 1998

[54] COPLANAR INTERLOCKING SHIELD

[75] Inventors: Paul M. Greco, Boca Raton; Julio C. Castañeda, Coral Springs, both of Fla.

[73] Assignee: Motorola, Inc., Schaumburg, Ill.

[21] Appl. No.: 709,703

[22] Filed: Sep. 9, 1996

[51] Int. Cl.$^6$ .................................................... H05K 9/00
[52] U.S. Cl. ...................... 174/35 R; 361/816; 361/752; 220/690
[58] Field of Search ...................... 174/52.1, 35 R, 174/35 MS; 361/816, 818, 752, 753, 760, 769, 799, 800, 829; 220/690, 682; 206/709

[56] References Cited

U.S. PATENT DOCUMENTS

| | | | |
|---|---|---|---|
| 2,262,758 | 11/1941 | Erne | 220/690 |
| 4,019,094 | 4/1977 | Dinger et al. | 361/220 |
| 4,084,720 | 4/1978 | Thurston | 220/76 |
| 4,335,270 | 6/1982 | Holce et al. | 174/52.1 |
| 5,170,321 | 12/1992 | Oslund et al. | 174/35 R X |

Primary Examiner—Kristine L. Kincaid
Assistant Examiner—Hung V. Ngo
Attorney, Agent, or Firm—M. Mansour Ghomeshi

[57] ABSTRACT

A shield (100) includes a raw sheet metal part (102) that is formed to include a tab 108 along with its biasing feature (110) at one end and a locating slot (114) at the other. This sheet metal part (102) is bent to form, whereby the tab (108) is engaged into the locating slot (114). The engagement of the tab (108) into the locating slot (114) is accompanied by the biasing feature (110) forcing the shield (100) to maintain a coplanar surface. The coplanarity of the shield (100) provides for an optimum soldering of the shield (100) to a circuit carrying substrate (300).

7 Claims, 2 Drawing Sheets

COPLANAR INTERLOCKING SHIELD

FIELD OF THE INVENTION

This invention is generally related to shielding components and more particularly to co-planar shields.

BACKGROUND OF THE INVENTION

Component flatness or coplanarity is an important design parameter of any sheet metal part that is soldered to a PC Board. If the part is not flat to an acceptable tolerance there will be gaps in the solder joints that can cause reliability problems and/or EMI problems in the case of shields.

Many footprint designs have been used for soldering sheet metal parts on to a PC board including blanking/bending and drawing processes, both of which have inherent drawbacks. Blanked/bent cans traditionally have a higher flatness tolerance associated with the cut and bent lines of the progressive die. Drawn cans, while having much improved flatness as compared to bent cans, have the drawback that they require a wider track for soldering. Soldering a sheet metal part on its edge requires a smaller PC board track footprint, 0.020 to 0.025 inches, as compared to drawn parts which have a skirt and typically require double the width, i.e., 0.040 to 0.050 inches. This drawback is less tolerated in today's electronic devices that are forced to realize significant operational objectives in smaller volumes.

One method of manufacturing a flat sheet metal part is to fixture the part after forming in the progressive die and spot weld or mechanically attach the two tree ends together. However, this approach is cost prohibitive as the labor associated with the secondary operation significantly increases the price of the part.

Accordingly, a need exists for a flat shield that overcomes the deficiencies of the prior art.

DESCRIPTION OF THE PREFERRED EMBODIMENTS

In building a metallic fence around components of a circuit carrying substrate, whether such fence is needed for shielding purposes or for the protection of components therein, one needs a part with a flat bottom surface in order to enhance its solderability to the PC board. The flat surface of the part avoids gaps that could provide for inconsistencies in the soldering. This problem is aggravated by the ever shrinking size of PC boards which renders shields with bent bottom surfaces unsuitable due to reliabiltity and EMI performance. The present invention provides a flat sheet metal perimeter that can be optimally soldered to a PC board without the additional space requirements that a drawn shield otherwise requires. By providing a flat or coplanar edge for soldering, this shield reduces unsoldered gaps and allows for a smaller track footprint which saves premium PC board real estate. Improved solder joints will inherently provide increased long term mechanical reliability and better Electro Magnetic Interferences (EMI) shielding.

Figure 1:
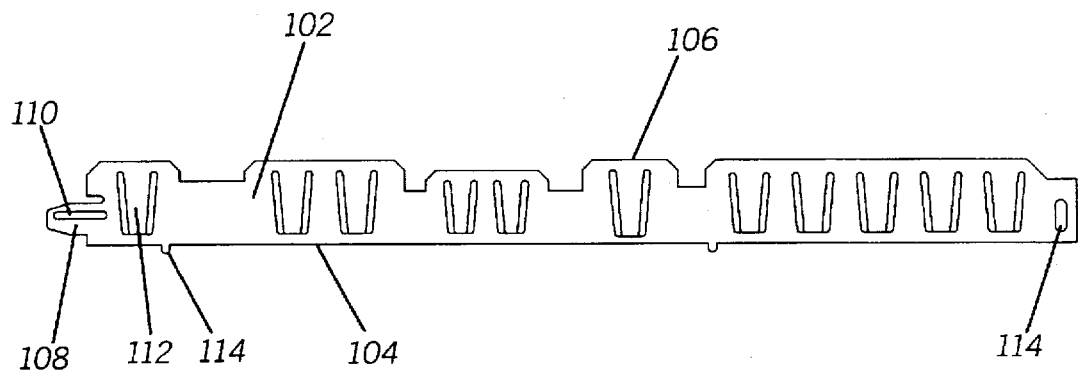
FIG. 1 shows a sheet metal part in its unbent form in accordance with the present invention.
Figure 2:
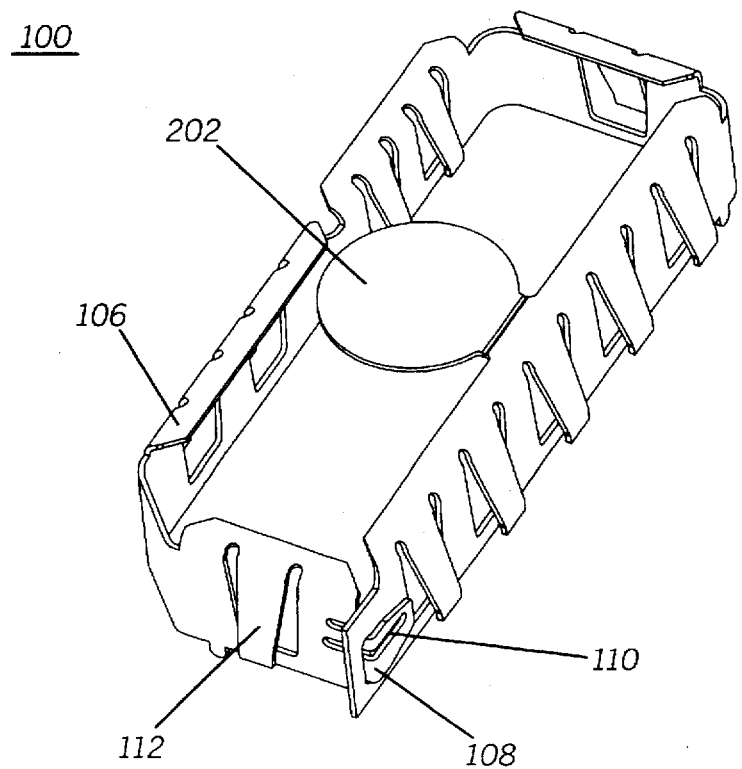
FIG. 2 shows a sheet metal part bent in accordance with the present invention.

The principles of the present invention will be better understood by referring to FIGS. 1 and 2 where like numerals are carried forward. Referring first to FIG. 1, a sheet metal part 102 that constitutes a fence or shield in accordance with the present invention in shown. In essence, the sheet metal part 102 includes first and second ends and is bent into a perimeter fence and crimped together in the progressive die at said ends. The crimp features embodies a tab 108 with a biasing feature 110 and a locating slot 114. The width of the tab 108 is equal to or greater than the width of the locating slot 114 to provide for the effective operation of the biasing feature.

This sheet metal part 102 is fabricated from a raw sheet stock material reel which is preferably automatically fed into a progressive die and stepped as dictated by the opening and closing of the progressive die. The raw material is blanked and bent in the progressive die creating spring loaded tabs or beams 112 which provide additional strength and rigidity to the part 100 (FIG. 2) as well as spring action for a cover that is placed over the part 100 when same is used as a shield. In general, the flat pattern 102 is punched into the raw material in the tools cut station. Of significance, is the fact that the bottom surface 104 is flangeless which requires less pad space on the PC board. The cut stations, which are machined in the tool steel, are held to tight tolerances and are very repeatable. In addition to the beams 112, the cut station blank the sheet metal 102 to include the tab 108, the biasing feature 110, and the locating slot 114. The biasing feature 110 is preferably a cut in the tab 108 having a width sufficient to provide direction force without permanent collapse. When the sheet metal has been cut to form 102, bend stations are used to bend the flat pattern into the desired shape, preferably a rectangular shield. Bend stations are less accurate because the memory or spring back of the raw material after it is bent creates additional tolerances which are dependent on the material and not the die. Indeed, the lack of accuracy and repeatability of bend stations adds to the significance of the present invention which aims to produce a shield with co-planar surface for ease of solderability. It is noted that the accurate step of cutting the sheet metal includes the cutting of the tab 108, the biasing feature 110, and the locating slot 114 which are the determining element in rendering the shield 100 flat on the bottom. Once the sheet metal 102 is bent in accordance with a desired pattern to form the shield 100, the tab 108 is forced into the slot 114 using the biasing feature 110 to render the first and second ends of the part 100 coplanar on the bottom surface. The tab 108 is then bent over along with its biasing feature 110 in order to interlock the two ends of the sheet metal 102 together. Because of the generous lead-ins, the tab 108 can be easily and controllably inserted into the slot 114 in order to avoid mismatch. This now coplanar sheet metal effectuates optimum soldering of the metallic fence 100 to the circuit carrying substrate without gaps or voids which are experienced when the bottom surface is not flat.

Referring to FIG. 2, the sheet metal 100 is shown in its bent form and the tab 108 locked in place. A pick and place spot 202 is included for possible use by an automatic pick and place machine. This tab 202 is removed once the shield 100 has been soldered to the PC board.

It is noted that all of the critical dimensions associated with the present invention are controlled in the flat pattern of the sheet metal 102. Therefore, the accuracy of these features can be maintained to a very tight tolerance, namely, ±0.002. The most significant attributes include the flatness of the bottom edge 104, the tab 108, the biasing feature 110 and the locating slot 114.

The location of the bottom edge of the tab 108 and the bottom edge of the locating slot 114 are maintained very accurately with respect to the bottom edge of the sheet metal part 104. This is desired in order to maintain the coplanarity of the overall shield 100. Further, the size of the tab 108 is sized to be slightly greater than or equal to the size of the locating slot 114. Once again, this is desired to force the bent piece 100 to maintain a coplanar bottom surface. The biasing feature 110 forces the bottom edges of the mating ends of the sheet metal parts 108 and 114 to be flush with each other thereby improving coplanarity by eliminating the accumulation of the forming tolerances. This is highly significant as this step eliminates the unreasonably high tolerances of the bending steps as explained earlier.

To increase the lateral stiffness of the individual sides of the shield 100, a bend at the top of the fence 106 is incorporated to form a flanged upper side. This bend 106 assures that the part will not deform at the corner bends while interlocking the two ends 108 and 114.

A sheet metal part with highly accurate tolerances have been shown to include necessary features to form a fence or a shield with coplanar bottom surface. The tab 108 along with its significantly important biasing feature 110 provide for the coplanarity of the shield piece part by mating to a complimentary locating slot 114 on the other side of the part 102. The biasing feature 110 provides the requisite forces needed to push the two ends of the sheet metal 102 to approach a flat a surface as possible and thereby provide for easy of solderability to the PC board.

Figure 3:
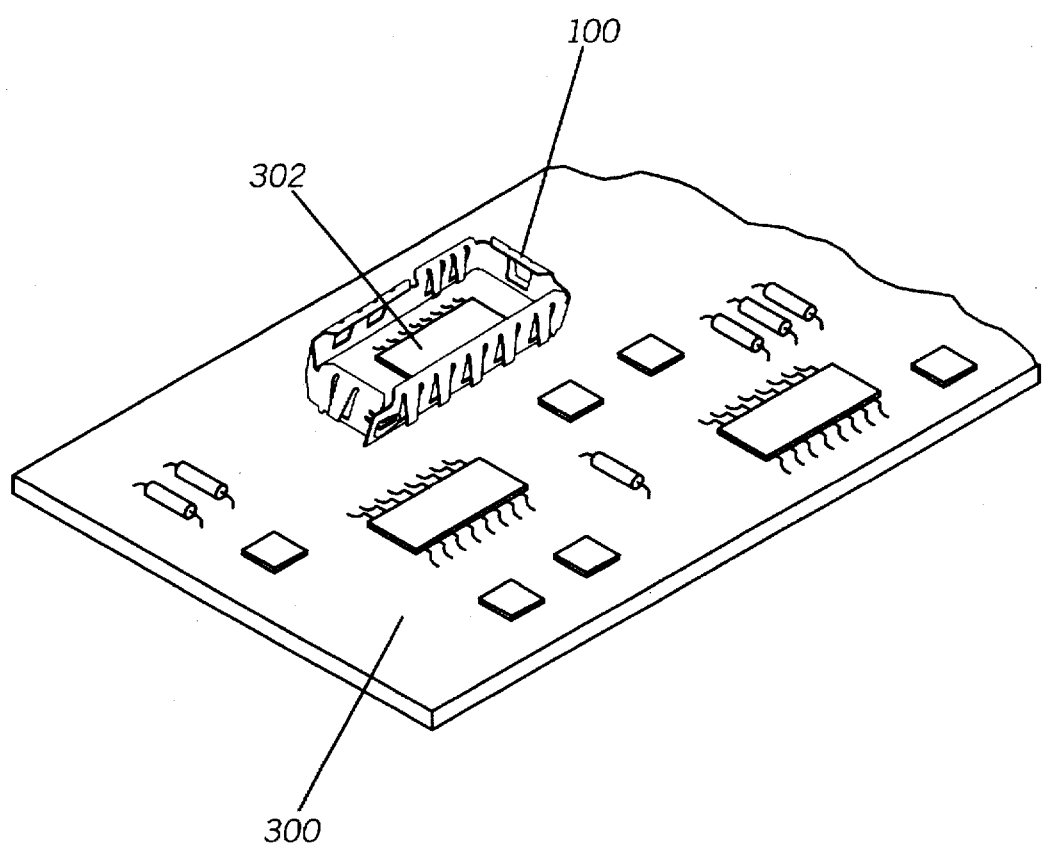
FIG. 3 shows a sheet metal part placed on a printed circuit board.

Referring to FIG. 3, a circuit carrying substrate 300 is shown with the shield 100 attached thereto. Solder or other adhesives used in the attachment of the shield 100 form a uniform track around the shield 100. This uniform fit provides for a more robust EMI protection. When a shield cap (not shown) is placed over the shield 100, the components 302 located within the perimeter of the shield 100 are protected against EMI or other interferences, including mechanical interference. It is understood that although the sheet metal 100 has been shown to include four sides or include tabs 112, or bends 106, that one could apply the principles of the present invention to shields having other geometrical configurations with additional details or fewer details yet incorporating the principles of the present invention.

We claim:

1. A metallic fence for protecting components on a circuit carrying substrate, comprising:

a single piece sheet metal part stamped to a desired specification, the sheet metal part comprising:
first and second ends;
a tab having a biasing feature and a tab width, the biasing feature including a cut in the tab; and
a locating slot for accepting the tab when the sheet metal is bent to a desired form, the locating slot having a width equal to or smaller than the tab width;
wherein the biasing feature forces the tab down in order to align the first and second ends of the sheet metal part to form a co-planar fence.

2. The metallic fence of claim 1, wherein the biasing feature includes a cut in the tab having a width sufficient to provide a directional force without a permanent collapse.

3. The metallic fence of claim 1, wherein the sheet metal part includes a flanged upper side.

4. A metallic fence for protecting components on a circuit carrying substrate, comprising:

a single piece sheet metal part stamped to a desired specification, the sheet metal part comprising:
first and second ends;
a tab having a biasing feature and a tab width; and
a locating slot for accepting the tab when the sheet metal part is bent to a desired form, the locating slot having a width equal to or smaller than the tab width;
a plurality of spring loaded beams for providing effective shielding to a mating party; and
wherein the biasing feature forces the tab down in order to align the first and second ends of the sheet metal to form a co-planar fence.

5. A metallic shield for shielding components on a circuit carrying substrate, comprising:

a single piece sheet metal part manufactured to a desired specification, comprising:
an upper side;
a flangeless lower side;
a plurality of spring loaded beams for providing effective shielding to a mating part;
a tab located on one end of the sheet metal part and having a biasing feature; and
a slot located on an opposite end of the sheet metal part for accepting the tab and biasing feature in order to allow the sheet metal part to be bent in a desired form having a coplanar-flangeless bottom surface for increased solderability to the circuit carrying substrate to optimize shielding.

6. The metallic shield of claim 5, wherein the upper side is flanged.

7. The metallic shield of claim 5, wherein the sheet metal part is bent to form a four sided part.

* * * * *